INVENTOR
FREDERICK BUCKLEY
BY John C Black
ATTORNEY

April 28, 1970 F. BUCKLEY 3,509,364

VIDEO AMPLIFIER PARTICULARLY ADAPTED FOR INTEGRATED CIRCUIT FABRICATION

Filed March 27, 1969 3 Sheets-Sheet 3

3,509,364
Patented Apr. 28, 1970

3,509,364

VIDEO AMPLIFIER PARTICULARLY ADAPTED FOR INTEGRATED CIRCUIT FABRICATION

Frederick Buckley, Endicott, N.Y., assignor to International Business Machines Corporation, Armonk, N.Y., a corporation of New York Filed Mar. 27, 1969, Ser. No. 811,113
Int. Cl. H03k *19/08*; H03f *3/18*
U.S. Cl. 307—203 15 Claims

ABSTRACT OF THE DISCLOSURE

A low-cost linear video amplifier has no resistors making it especially adaptable for heavily integrated monolithic fabrication, and is characterized by high bandwidth, low and equal power dissipation in each transistor in the same stage for minimum local temperature gradients, and gain substantially independent of voltage supply levels, supply variations and ambient temperature variations within limits. Each stage comprises $m$ matched common emitter transistor amplifiers with $n$ matched transistors operated as diodes (i.e., short-circuited base-collector electrodes) across the amplifier base-emitter junctions to provide a gain of $m/n$. Succeeding stages have transistors of opposite conductivity types and the transistor-diodes of each stage provide the load for the next preceding stage.

The improved amplifier is particularly useful as an accurate, resistorless current source, a resistorless high bandwidth gain element for more complex circuits, and an interface between digital switching circuits.

BACKGROUND OF THE INVENTION

Field of the invention

The present application is directed primarily to the field of small signal, linear amplifiers; however, as will be seen below, certain implementations of the improved video amplifier are particularly well adapted to interconnect (or interface) high-speed digital logic circuits of the same different or family types with similar or different power supply and logic levels.

The improved circuit is particularly well adapted for construction on a single semi-conductor chip by conventional monolithic techniques; and, in fact, to some extent relies upon monolithic fabrication for optimum low-cost implementation, i.e., low-cost transistors with matched characteristics are more readily achieved in monolithically fabricated integrated circuit structures.

The improved amplifier permits minimum power supply levels (which need not be accurately controlled) and, therefore, minimizes the likelihood of transistor breakdown, permitting maximum geometry freedom in the fabrication. Power dissipation is minimized permitting higher power output from smaller, less expensive packages for mounting the circuits. The improved stable, wideband amplifier has relatively accurate temperature insensitive gain from D.C. to about $ft/4$.

The improved amplifier can, with the exception of resistors necessary to transform voltage into current, be fabricated solely of transistors. Since the total number and value of the resistor elements is kept at a minimum, the chip area for a given circuit can be reduced thereby increasing the number of circuits for a given wafer. Alternatively, the one or few resistors which are required can now be discrete elements removed from the chip without unduly increasing the number of semiconductor chip terminals required. Because the signals are predominantly currents rather than voltages, transient performance is relatively insensitive to the junction-capacitive environment on monolithic chips.

It is, therefore, the primary object of the present invention to provide an extremely simplified bipolar transistor circuit which is particularly well adapted for monolithic fabrication to perform the function of linear current amplification at very high speeds with good accuracy, dynamic range and low cost.

It is another object of the present invention to provide an improved linear amplifier which is particularly well adapted for monolithic fabrication, which exhibits high frequency response, minimum power dissipation, maximum dynamic range and minimum power supply levels.

Description of the prior art

The improved amplifier of the present application makes use of the teachings of copending U.S. patent application Ser. No. 513,395 of R. Ordower, filed Dec. 13, 1965, for a "Transistor Amplifier With Gain Stability"; and said copending application is hereby incorporated herein by reference. Said copending application teaches and claims the use of one or more diodes in the form of transistors having their base-collector electrodes short-circuited and connected across the base-emitter electrodes of one or more transistor amplifiers to control the output current of the amplifier as a function of input current into the diodes. The diodes and the transistor amplifier have base-emitter voltage-current characteristics matched as perfectly as practical to provide a ratio of total amplifier collector current to total diode current which is an inverse function of the number of diodes and a direct function of the number of transistor amplifiers. For example, one diode and one amplifier provides a current ratio of one; two diodes and one amplifier provides a ratio of one-half; one diode and two amplifiers provide a ratio of two, and so on.

The ratio of amplifiers to diodes which can be connected in this manner to produce accurate output currents is limited by the Beta of the transistors. In order to maintain the desired current relationships between the ratio of output current ($y$) to input current ($x$) obtained by connecting $m$ amplifiers and $n$ diodes in this manner is $$\frac{y}{x}=\frac{\alpha\frac{m}{n}}{1+\frac{\alpha m}{\beta n}}$$

where $\alpha=\beta/(\beta+1)$, $\beta$ is an average $\beta$ for the amplifiers, and the base-emitter voltage-current characteristics are matched to maintain an accurate gain (or ratio) $\alpha m/\beta n$ must be small with respect to unity.

SUMMARY OF THE INVENTION

In a preferred embodiment, each stage of a video amplifier comprises a plurality of $m$ transistor amplifiers of the same conductivity type having their base electrodes connected together, their emitter electrodes connected together, and their collector electrodes connected together. $n$ additional transistors of the same conductivity type (hereinafter referred to as diodes) have their base and collector electrodes connected together and are connected across the base-emitter junctions of the amplifiers. The base-emitter voltage-current characteristics of all diodes and amplifiers in the same stage are substantially matched producing a stage current again substatnially equal to $m/n$. The diodes and amplifiers of succeeding stages are of opposite conductivity type, the diodes of each stage forming the load for the preceding stage, permitting the use of a power supply equal to about two transistor VBE (base-emitter voltage) drops, approximately 1.3 volts.

It has been discovered that one particularly advantageous application for the improved video amplifier is its use as an interface between digital logic circuits.

In this interface application, the improved amplifier is capable of interconnecting digital circuits of the same or different family types with the same or different power supply and logic levels.

The foregoing and other objects, features and advantages of the invention will be apparent from the following more particular description of preferred embodiments of the invention as illustrated in the accompanying drawings.

DETAILED DESCRIPTION OF THE PREFERRED EMBODIMENTS

Figure 1A:
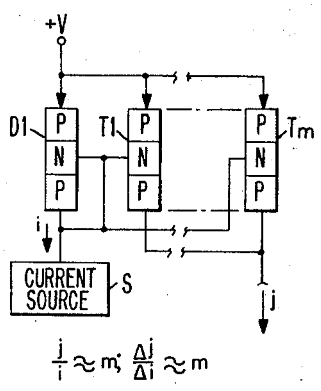
FIGS. 1*a*, 1*b* and 1*c* are fragmentary schematic diagrams illustrating basic known principles upon which the improvements of the present application are based.
Figure 1B:
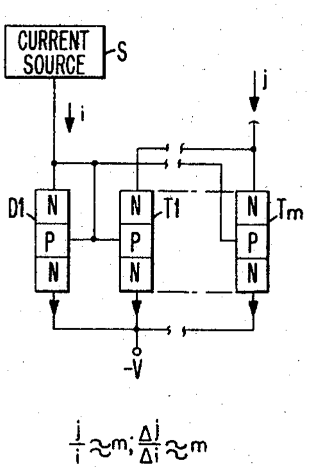
Figure 1C:
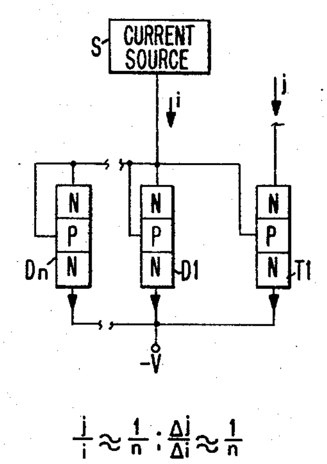

FIGS. 1*a*–1*c* illustrate current relationships upon which the present improvement is based.

FIG. 1*a* shows a diode D1 in the form of a PNP transistor having its base-collector electrodes short-circuited. The emitter of the transistor is connected to a positive voltage supply terminal +V and the base-collector electrodes are connected to a current source S. The diode is connected across the base-emitter junctions of a plurality of PNP transistors T1 through T*m*, inclusive, operated as amplifiers. The transistors D1 and T1–T*m* are matched. The emitter electrodes of the transistors T1 through T*m* are connected directly to the emitter electrode of the diode D1 and the positive supply terminal. The collector electrodes of the transistors T1 through T*m*, inclusive, are connected directly to each other. The total output current $j$ divided by the input current $i$ (and changes in $j$ divided by changes in $i$) are substantially equal to $m$, the number of transistors in the group T1 through T*m* inclusive. These relationships are shown in the drawing, FIG. 1*a*. The approximate relationships assume that the Beta ($\beta$) gain of the transistors is sufficiently high to disregard the small currents flowing into the base electrodes of the amplifiers T1–T*m*.

FIG.1*b* illustrates a circuit which is essentialy the same as and produces the same current relationships as the circuit of FIG. 1*a* except that the diode D1 and the transistors T1–T*m*, inclusive, are comprised of matched NPN-type transistors, rather than the PNP-type of FIG. 1*a*. This requires that the emitter electrodes of the diode and transistors be connected to a power supply —V. The same current relationships exist as those of the circuit of FIG. 1*a*, i.e., $$\frac{j}{i} \approx m$$

and changes in the current $j$ are substantially equal to $m$ times changes in the current $i$.

Thus in FIG. 1*a* or FIG. 1*b*, if there were two transistor amplifiers and one diode, the current $j$ would be equal substantially to twice the current $i$.

In FIG. 1*c* there are shown a plurality of matched transistor diodes D1–D*n*, inclusive, and only one matched transistor amplifier T1. The emitter electrodes of the transistors are connected to a supply terminal —V and the short-circuited base-collector electrodes of the diodes are connected to the current source S. In this instance, the output current $j$ is equal to the input current $i$ divided by the number of diodes, i.e., $n$. In this instance, if two diodes were provided and one transistor amplifier, the output current $j$ would equal one-half the input current $i$.

Various input to output current relationships may be achieved by varying both the number of diodes and the number of transistor amplifiers connected in a manner shown in FIGS. 1*a*, 1*b* and 1*c*, inclusive. For example, if two diodes and three transistor amplifiers were connected in the manner illustrated, the output current $j$ would be three halves the input current $i$.

These basic current relationships will be utilized in the improved circuits illustrated in the figures to be described in detail below.

Figure 2:
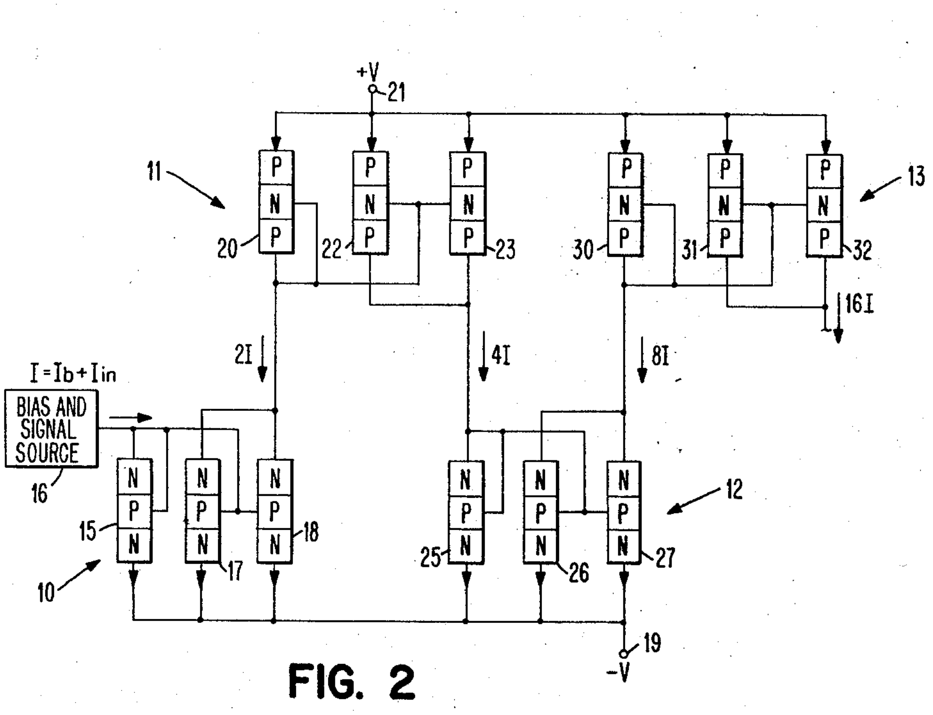
FIG. 2 is a schematic diagram of one preferred form of the video amplifier embodying the improvements of the present application.

FIG. 2 illustrates one preferred form of a linear video amplifier having four stages 10, 11, 12 and 13. The first stage 10 comprises a first NPN transistor 15 having its base-collector electrodes short-circuited to operate as a diode. The base-collector electrodes are connected directly to a source of bias and input signals 16 and to the base electrodes of a pair of transistor amplifiers 17 and 18. The emitter electrodes of the transistors 15, 17 and 18 are connected to a negative supply terminal 19.

As shown in FIG. 2, the total current I from the source 16 is equal to a bias current I*b* plus an input signal current $I_{in}$. To assure linear operation, $I_{in}$ must never be of a polarity and value to cause I to reverse direction or to result in saturation of any amplifier. Since there is one diode and two transistor amplifiers in the first stage 10, its output current at the junction of the collector electrodes of the transistor amplifiers will be equal substantially to twice the value of the input current or 2I.

This output current is applied to a PNP transistor 20 in the second stage 11. The transistor 20 has its base-collector electrodes short-circuited and its emitter electrode connected to a positive supply terminal 21. The second stage 11 also includes a pair of PNP transistor amplifiers 22 and 23 having their emitter electrodes connected to the terminal 21 and their base electrodes connected directly to the short-circuited base-collector electrodes of the transistor diode 20. The stage 11 includes one diode 20 and two transistor amplifiers 22 and 23 whereby its output current will be equal substantially to twice its input current or 4I.

This output current from the stage 11 is applied to an NPN transistor 25 in the third stage 12. The transistor 25 has its base-collector electrodes short-circuited and connected to the output collector electrodes of the transistors 22 and 23. The emitter electrode of the transistor 25 is connected to the supply terminal 19. The stage 12 includes a pair of NPN transistor amplifiers 26 and 27 having their emitter electrodes connected to the terminal 19 and their base electrodes connected directly to the short-circuited base-collector electrodes of the diode 25.

Since the stage 12 has one diode and two transistor amplifiers, its collector output current is equal to twice its input current or 8I. This output current from the stage 12 is applied to a PNP transistor 30 of the final stage 13. The transistor 30 has its base-collector electrodes short-circuited to operate as a diode and has its emitter electrode connected to the terminal 21. The stage 13 further includes a pair of PNP transistor amplifiers 31 and 32 having their emitter electrodes connected to the supply terminal 21 and their base electrodes connected directly to the short-circuited base-collector electrodes of the diode 30.

Since the stage 13 has one transistor operating as a diode and two transistor amplifiers its output current from the collector electrodes of the amplifiers 31, 32 is twice its input current or 16I.

The stages 10–13 of the amplifier of FIG. 2 are operated in the linear region, i.e., neither at saturation or cutoff. One requirement for linear operation is that $I_{in}$ (which can change polarity) be no greater than I*b*. That is, I must never be negative. In addition, the value of I must not be so large as to cause saturation in any transistor.

The level of the bias current I*b* is set to a desired level which assures linear operation of each stage. With zero input signal current $I_{in}$, the bias current of each transistor 17 and 18 approximately equals I*b*. This produces an output steady state current from transistors 17 and 18 approximately equal to 2I*b*.

The total output steady state current from transistors 22, 23 is approximately twice that of the transistors 17, 18 or 4I*b;* the output steady state current of transistors 26, 27 being 8I*b;* and that of transistors 31, 32 being 16I*b*.

It can be seen in FIG. 2, that the load for each stage is a diode, e.g., diode 20 is the load for stage 10, diode 25 for stage 11, and diode 30 for stage 12.

When input signals $I_{in}$ to be amplified are applied to the first stage 10, their value is substantially doubled in each stage to produce at the output of stage 13 a change in current substantially equal to $16I_{in}$.

The specific amplifier of FIG. 2 is given by way of example. It will be appreciated that the number of diodes such as 15 and amplifiers such as 17, 18 in each stage such as 10 may be varied to produce a stage gain substantially equal to the total number of amplifiers divided by the total number of diodes.

FIGS. 3*a* through 3*d*, inclusive, and FIG. 4 will be described in detail. These figures illustrate a particularly useful application of the teachings of the present application as an interface between high-speed digital logic circuits. It is common to interpose between the output terminals of transistor switching circuits in one unit and corresponding input terminals of transistor switching circuits in another unit additional circuitry commonly called an interface which permits communication between the different switching circuits irrespective of the circuit family type and logic supply levels.

As the speed of digital switching circuits increases dramatically and as the circuit density of integrated circuits increases, interface problems arise between electrically interconnected circuits mounted on adjacent boards in the same unit, particularly in the central processing unit of a data processing system.

The improved video amplifier of the present application is particularly well adapted to provide an efficient, low-cost, reliable solution to many of these interface problems.

Figure 3A:
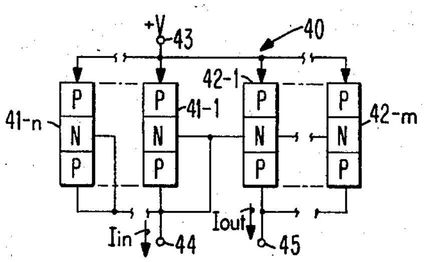
FIGS 3*a* through 3*d*, inclusive, are fragmentary schematic diagrams illustrating various forms which the improved amplifier of the present application may take when utilized as a high speed interface between remotely spaced digital transistor switching circuits.

FIG. 3*a* shows a first type of interface block 40 comprising a group of first PNP transistors 41–1 to **41–*n* and a second group of PNP transistors 42–1 to 42–*m* inclusive. The transistors 41–1 to 41–*n* have their base-collector electrodes short-circuited and connected directly to the base electrodes of the transistors 42–1 to 42–*m*. The emitter electrodes of all of the transistors are connected to a positive supply terminal 43. An input terminal 44 is adapted to be connected to the output of a respective first transistor digital switching circuit (not shown). An output terminal 45 is adapted to connect the collector electrodes of the transistors 42–1 to 42–*m*** to a second transistor digital switching circuit (not shown).

The interface block 40 is adapted to interconnect the first and second transistor switching circuits which normally have current flowing from a source of positive potential into the output terminal (not shown) of the first switching circuit and which normally has current flowing from a positive source into the input terminal (not shown) of the second transistor switching circuit. The level of the current $I_{in}$ flowing from the supply 43 to the first transistor switching circuit by way of the transistors 41–1 to **41–*n* and the terminal 44 is controlled to be at a value substantially equal to that which the first transistor switching circuit normally produces in its first and second states. A predetermined current level must be supplied to the input to the second transistor switching circuit from the supply terminal 43 by way of the transistors 42–1 to 42–*m* and the output terminal 45. The number of transistors 41–1 to 41–*n* and 42–1 to 42–*m*** are selected according to the equation $$I_{out} \approx I_{in} \frac{m}{n}$$

That is, the ratio *m*/*n* times the minimum available input current $I_{in}$ must equal or exceed the maximum current $I_{out}$ required by the switching circuit to which it is connected.

Figure 3B:
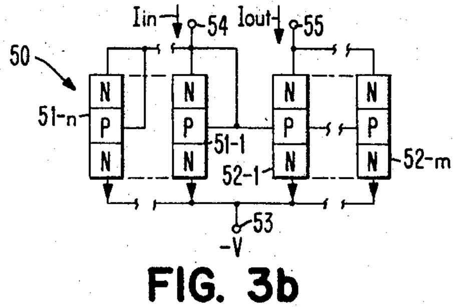

FIG. 3*b* shows an interface block 50 having a plurality of NPN transistors 51–1 to **51–*n* and a plurality of NPN transistors 52–1 to 52–*m*. The interface block 50 is generally similar to the interface block 40** of FIG. 3*a* except that the transistor conductivity types are the opposite, the supply terminal 53 to which the emitter electrodes are connected is of a negative polarity rather than a positive, and the direction of the input and output currents $I_{in}$ and $I_{out}$ are opposite in direction. Each of the transistors 51–1 to **51–*n* has its base-collector electrodes short-circuited to operate as a diode and the short-circuited base and collector electrodes are connected directly to each other, directly to an input terminal 54 and directly to the base electrodes of the transistor amplifiers 52–1 to 52–*m* inclusive. The collector electrodes of the transistor amplifiers 52–1 to 52–*m* are connected directly to each other and to the output terminal 55**.

Attention is directed to the use of positive (+V) and negative (−V) supply terminals throughout the drawings. It will be appreciated that these need not represent only absolute positive and negative supply values, but rather they also can represent relative supply levels, i.e., −V is more negative than +V within the limits of saturation (~1.3 volts) and breakdown, with both values being positive with respect to some reference.

Figure 3C:
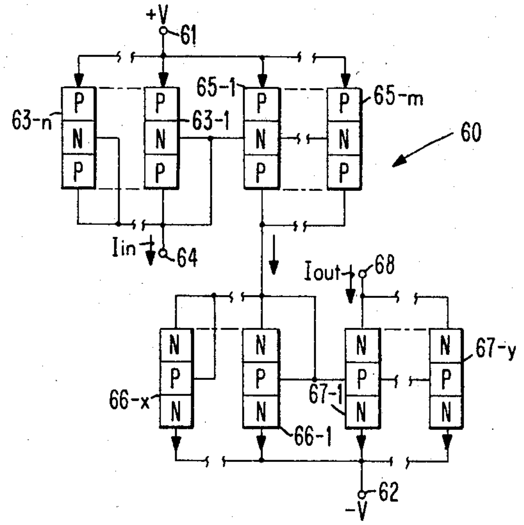
Figure 3D:
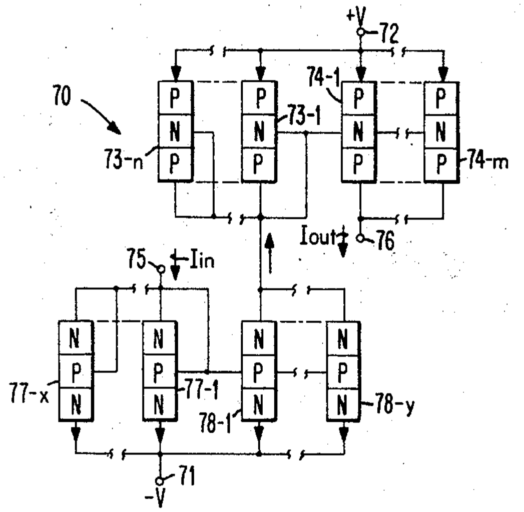

FIG. 3*c* shows an interface block 60 which is provided in those instances in which the input current $I_{in}$ flows from a positive supply terminal 61 to a first transistor switching circuit (not shown) and in which the output current $I_{out}$ flows from the second transistor switching circuit (not shown) to a negative supply terminal 62.

The interface block 60 includes a first set of PNP transistors 63–1 to **63–*n* having their base-collector electrodes short-circuited to act as diodes and connected directly to each other and to an input terminal 64. The interface block also includes a plurality of PNP transistor amplifiers 65–1 to 65–*m* having their collector electrodes connected directly to each other, having their base electrodes connected directly to each other, and directly to the short-circuited base-collector electrodes of the transistors 63–1 to 63–*n*. The emitter electrode of the transistors 63–1 to 63–*n* and 65–1 to 65–*m* are connected directly to each other and to the supply terminal 61**.

The interface block 60 further comprises a plurality of NPN transistors 66–1 to **66–*x*** having their base-collector electrodes short-circuited and connected directly to each other and directly to the collector electrodes of the transistors 65–1 to 65–$m$. The interface block 60 further comprises a plurality of NPN transistor amplifiers 67–1 to 67–$y$ having their collector electrodes connected directly to each other and to an output terminal 68 and having their base electrodes connected directly to each other and to the short-circuited base-collector electrodes of the transistors 66–1 to 66–$x$. The emitter electrodes of the transistors 66–1 to 66–$x$ and 67–1 to 67–$y$ are connected directly to each other and directly to the supply terminal 62.

The number of transistors in each group such as 63, 65, 66 and 67 are selected according to the equation $$I_{\text{out}} \leqq I_{\text{in}} \frac{my}{nx}$$

As in the preceding inequality, $I_{out}$ and $I_{in}$ are maximum required and minimum available current levels, respectively.

FIG. 3$d$ shows an interface block 70 similar to block 60 which is used when the input current $I_{in}$ flows from a first transistor switching circuit (not shown) into a negative supply terminal 71 and in which the output current $I_{out}$ flows from a positive supply terminal 72 toward the second transistor switching circuit (not shown).

The interface block 70 includes a first plurality of PNP transistors 73–1 to 73–$n$ having their base-collector electrodes short-circuited and connected directly to each other. The interface block 70 also includes a group of PNP transistor amplifiers 74–1 to 74–$m$ having their collector electrodes connected directly to each other and directly to an ouptut terminal 76 and their base electrodes connected directly to each other and directly to the base-collector electrodes of the transistors 73–1 to 73–$n$. The emitter electrodes of the transistors 73–1 to 73–$n$ and 74–1 to 74–$m$ are connected directly to each other and to the terminal 72.

The interface block 70 also comprises a plurality of NPN transistors 77–1 to 77–$x$ having their base-collector electrodes short-circuited and connected directly to each other and directly to an input terminal 75. The interface block 70 also includes an additional plurality of NPN transistor amplifiers 78–1 to 78–$y$ having their collector electrodes connected directly to each other and directly to the short-circuited base-collector electrodes of the transistors 73–1 to 73–$n$. The base electrodes of the transistor amplifiers 78–1 to 78–$y$ are connected directly to the short-circuited base-collector electrodes of the transistors 77–1 to 77–$x$, inclusive, and directly to the input terminal 75. The emitter electrodes of the transistors 77–1 to 77–$x$ and the transistor amplifiers 78–1 to 78–$y$ are connected directly to each other and to the negative supply terminal 71. The selection of the number of transistors in each group is in accordance with the equation $$I_{\text{out}} \leqq I_{\text{in}} \frac{my}{nx}$$

Figure 4:
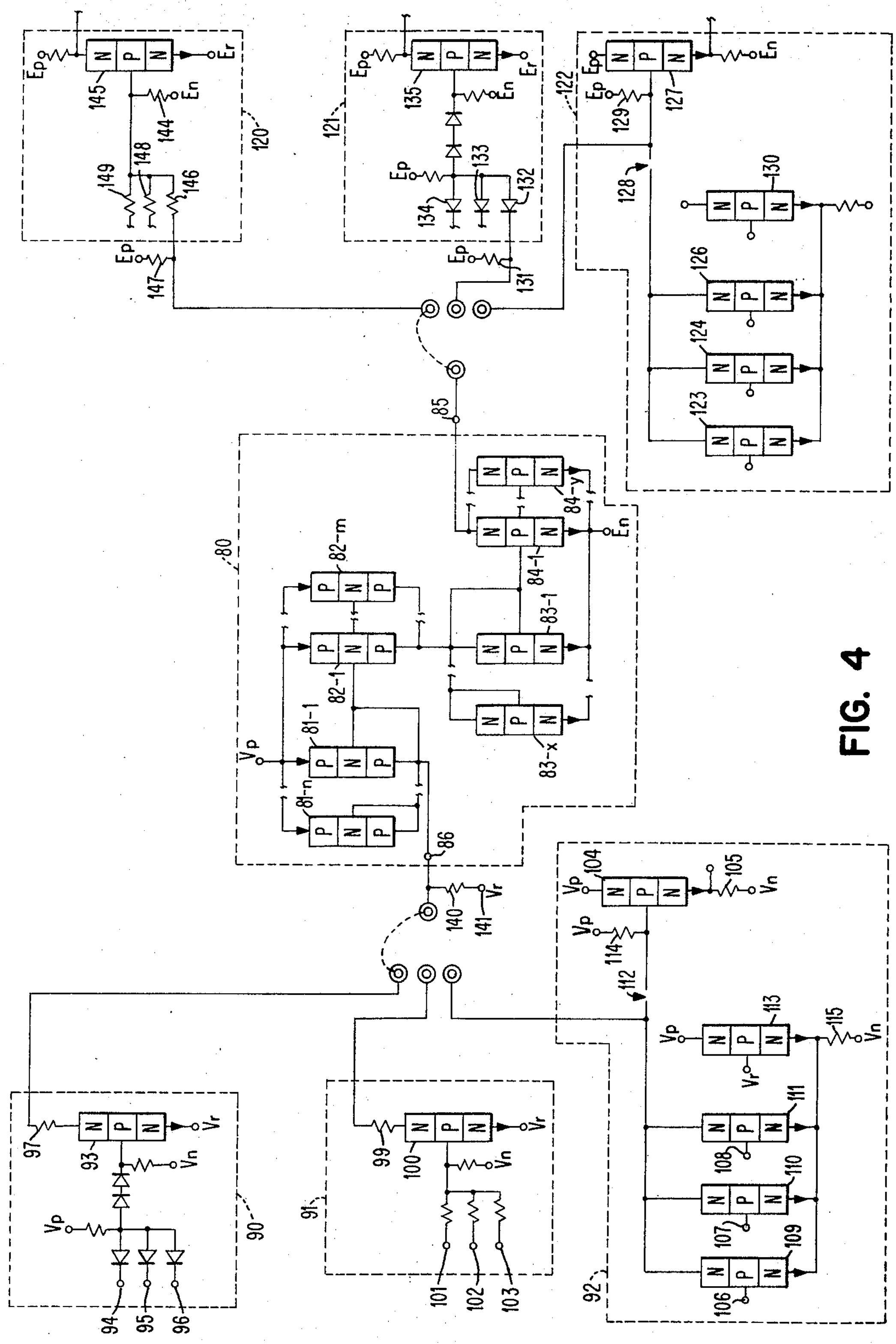
FIG. 4 is a fragmentary schematic diagram illustrating one form of the improved interface and various types of digital logic circuits which it may be utilized to interconnect.

FIG. 4 illustrates one manner in which the various interface blocks of FIGS. 3$a$ to 3$d$ may be utilized to interconnect typical transistor digital switching circuits. By way of example, FIG. 4 shows the type of logic intreface block which is shown in FIG. 3$c$. The logic block 80 comprises a plurality of PNP transistors 81–1 to 81–$n$, inclusive, connected to operate as diodes and a plurality of transistor amplifiers 82–1 to 82–$m$ having the transistors 81 connected across their base-emitter junctions. The transistor amplifiers 82–1 to 82–$m$ are connected in parallel with their collector electrodes being connected to a plurality of NPN transistors 83–1 to 83–$x$. The transistors 83 have their base-collector electrodes short-circuited to operate as diodes. The transistors 83 are connected across the base-emitter electrodes of a plurality of NPN transistor amplifiers 84–1 to 84–$y$. The latter transistor amplifiers are connected in parallel and have their collector electrode connected to an output terminal 85.

An input terminal 86 of the logic interface block 80 is connected to the short-circuited base-collector electrodes of the transistors 81. The emitter electrodes of the transistors 81 and 82 are connected directly to each other and to a positive supply terminal indicated as V$p$. The emitter electrodes of the transistors 83 and 84 are connected directly to each other and to a negative supply terminal E$n$.

The input terminal 86 is shown as being connectable alternatively to any one of the three types of transistor switching circuits 90, 91 or 92. The transistor switching circuit 90 is typically referred to as diode-transistor logic and normally applies the reference voltage V$r$ to an output terminal when its transistor 93 is turned on. AND normally applies a positive supply potential V$p$ to an output terminal (usually the collector electrode) when the transistor 93 is turned off. Positive input potentials are applied simultaneously to the input terminals 94, 95 and 96 in order to turn the transistor 93 on to its low impedance state, i.e., a positive AND function is performed.

The transistor switching circuit 91 is of the type commonly referred to as resistor-transistor logic, and applies to the collector output terminal of its transistor 100 the reference potential V$r$ when the transistor is on. When the transistor is off, a positive potential V$p$ is applied to the collector output electrode. The transistor is turned on to its low impedance state when positive potentials are applied simultaneously to the input terminals 101, 102 and 103, i.e., a positive AND function.

The transistor switching circuit 92 is of a type commonly referred to as current switch emitter follower logic and is typically operated at much higher speeds than the circuits 90 and 91. The output signals of the type of transistor switching circuit shown at 92 are derived at an emitter output terminal 105 as a function of input signals at the input terminals 106, 107 and 108 of NPN transistors 109, 110 and 111, respectively. Normally, the collector electrodes of the transistors 109, 110 and 111 are coupled to the base electrode of the transistor 104 but when the switching circuit 92 is to be coupled to a remote switching circuit by way of the logic interface block 80, the connection between the collector electrodes and the base electrode is open circuited as illustrated at 112. Normally (i.e., no open circuit 112), a transistor 113 is conducting and the transistors 109, 110 and 111 are non-conducting, whereby a positive supply potential V$p$ is applied to the transistor 104 by way of the bias resistor 114 to turn the latter transistor on and apply the positive potential V$p$ to the output terminal 105. If a potential is applied to any one of the input terminals 106, 107 or 108, which potential is more positive than the reference potential V$r$ applied to the base electrode of the transistor 113, it will cause its respective transistor to turn on and the transistor 113 to turn off, i.e., a positive OR function. In this condition, an intermediate voltage level of desired value between the values of V$p$ and V$n$ is applied to the base electrode of the transistor 104 to produce at the output terminal 105 a desired intermediate voltage level.

As seen in FIG. 4, an output terminal 85 of the logic interface block 80 is connectable alternatively to any one of the illustrated transistor switching circuits 120, 121 or 122. The transistor switching circuits 120, 121 and 122 are similar to the transistor switching circuits 91, 90 and 92, respectively.

It will be noted in the transistor-switching circuit 122 that the normal connection between the transistors 123, 124 and 126 and the base electrode of the transistor 127 are open-circuited at 128. In this instance, the open circircuit permits coupling of the transistor 127 and its bias resistor 129 to the output terminal 85 whereas, in the switching circuit 92, the corresponding transistor and resistor are not utilized and only the transistors 109, 110, 111 and 113 are effective and connected to the input terminal 86. In the switching circuit 122, the transistors 123, 124, 126 and 130 are not utilized. The coupling of the resistor 114 and transistor 104 to V*p* and V*n* is for illustration of normal circuit operation only, no such connections being made when the circuit 92 is coupled to a logic block such as 80.

In FIG. 4, the value of the voltage supply to the interface block 80 (*Vp—En*) must be equal to or greater than two diode drops (e.g., approximately 1.3 volts) and less than the breakdown voltage of the transistors therein. Current levels in each transistor of interface block 80 should be such that adequate matching can be maintained.

Assume for the following description of the operation that the interface block 80 is connected to the transistor-switching circuit 90 and to the transistor-switching circuit 120. Assume further that at least one of the input terminals 94, 95 or 96 does not have a positive potential applied thereto whereby the transistor 93 is in its non-conducting state.

As indicated earlier, the transistors in the interface block 80 should be operated in their linear regions at all times in the interest of speed. Therefore, a resistor 140 is connected between the input terminal 86 of the interface block 80 and the reference supply terminal 141. The value of the resistor 140 is selected to be large enough so that when the transistor 93 is in its non-conducting state, the resistor 140 supplies a very low level current, for example, five or ten percent of the normal on current of transistor 93 to the diodes 81–1 and **81–*n* of the interface block 80**.

If we assume that there is only one transistor in the group 81–1 to **81–*n* and in each of the other groups 82–1 to 82–*m*, and 81–1 to 83–*x*, and 84–1 to 84–*y*, then the interface block 80 will produce at the output terminal 85 a current substantially equal to the input current from the resistor 140**.

When this very low level of current appears at the output terminal 85 of the interface block 80 it is applied to a bias resistor 147, the opposite end of which is connected to a positive supply terminal E*p*. The level of current flowing through the resistor 147 will be so low as to cause the potential at the junction between the resistors 146 and 147 to be substantially equal to the normal up level of a singly loaded output. Since it is assumed that only the input connected to block 80 of blocks 120, 121 and 122 is used, this level will be sufficiently positive to cause turn-on of the transistor 145 at the desired high level of conduction, for example, saturation.

When positive input signals are applied simultaneously to each of the input terminals 94–96 of the circuit 90, they cause the transistor 93 to be turned on to its high conduction level (for example, saturation). With the transistor 93 turned on, a circuit is established between the supply terminals V*p* and V*r* by way of the transistor diode 81–1, the input terminal 86, the load resistor 97 and the transistor 93. The value of the current flowing in this path is substantially equal to the difference between the potentials V*p* and V*r*, less the diode drop across 81, divided by the value of the resistor 97. The value of this current is very high as compared with the value of current supplied via resistor 140 when the transistor 93 is turned off. Again the output current at terminal 85 is substantially equal to the input current at terminal 86, and this higher current value produces a voltage drop across the resistor 147 which is sufficient to cause turn-off of the transistor 145.

The operation is substantially the same when the input terminal 86 is connected to the circuit 91 instead of to the circuit 90. As in the case described above with respect to circuit 90, the input and output current levels of the interface circuit 80 will be substantially equal and at a very low level determined essentially by the value of resistor 140 when the transistor 100 of the circuit 91 is non-conducting. When the transistor 100 is turned on, the value of the current will be relatively high as determined essentially by the value of the resistor 99 in the collector circuit of the transistor 100.

As in the preceding example, where the circuit 90 was utilized, a low value current at the output terminal 85 when the transistor 100 is turned off causes the transistor 145 to be turned on. On the other hand, when the transistor 100 is turned on causing a high level current at the output terminal 85 of the interface logic block 80, the potential at the junction between the resistors 146 and 144 will be sufficiently negative with respect to the potential E*p* to cause turn-off of the transistor 145.

If the input terminal 86 is connected to the circuit 92 and the output terminal 85 is still connected to the circuit 120, the operation will be substantially as follows. If the input signals to the terminals 106, 107 and 108 are each more negative than the reference potential V*r* applied to the base electrode of the transistor 113, the transistor 113 will be turned on and the transistors 109, 110 and 111 will be turned off. This condition will cause the current flowing into the input terminal 86 of the interface block 80 to be determined as in the previous cases by the value of the resistor 140. As in the previous cases, this input current will result in a substantially positive potential being established at the junction between the resistor 146 and 144 of the circuit 120.

However, in the event that any one or more of the input terminals 106, 107 and 108 has applied thereto a potential more positive than the reference potential V*r*, then the corresponding transistors 109, 110 and 111 will be turned on to their high conductivity states to cause the input current to the terminal 86 to be at a relatively high level determined essentially by resistor 115.

This high level current applied to the input terminal 86 will cause a corresponding high level of output current at the output terminal 85. This output current will cause a relatively negative potential to be established at the junction between the resistors 146 and 144 causing the transistor 145 to turn off.

If we assume now that the output terminal 85 of the interface block 80 is connected to the circuit 121 rather than circuit 120 and further assume that the input terminal 86 of the interface block is connected to any one of the possible input circuits 90, 91 or 92, then the circuit 121 will be controlled in a manner somewhat similar to that described with respect to circuit 120.

More particularly, if the very low level of input current is applied to the input terminal 86 determined by the resistor 140, this will cause a very low level to flow through the resistor 131 to establish at the junction between the resistor 131 and its associated diode 132 a positive voltage level substantially equal to E*p*. A sufficiently positive potential will be established at the base electrode of the transistor 135 to turn the latter on.

However, if the input current to the terminal 86 is a relatively high value as determined by the input circuit 90, 91 or 92 which is connected thereto, then a corresponding high level output current from the terminal 85 will cause a relatively negative voltage to be applied to the junction between the resistor 131 and the diode 132. This will cause the potential at the base electrode of the transistor 135 to be too negative to permit turn on of the transistor.

It has been assumed in the above descriptions that circuits 120 and 121 have only one connected input (e.g., resistor 146, diode 132). It will be appreciated that logical AND functions can be achieved by circuits 120 and 121 if appropriate input signal sources are coupled to resistors 148, 149 and diodes 133, 134.

If it is assumed that the circuit 122 is connected to the output terminal 85 of the logic interface block 80, then a low level input current to the input terminal 86 and a corresponding low level output current from the terminal 85 will result in a positive potential substantially equal to Ep being applied to the base electrode of the transistor 127 resulting in a voltage at the emitter output electrode of the transistor 127 being equal to the base voltage less a base-emitter voltage drop.

In the event that the circuit 90, 91 or 92 which is connected to the interface block 80 supplies a high level of current to the input terminal 86, a corresponding high level of current will be produced at the output terminal 85 and applied to the transistor 127 and its bias resistor 129. This high level of current will cause a relatively negative potential to be established at the base electrode of the transistor 127 and the potential at the output emitter electrode of the transistor will have a voltage level one diode drop below that at its base electrode.

In all cases, the current supplied by the interface block 80 to the various transistor switching circuits 120, 121 or 122 will be at the high level of current which is normally required by the particular circuit to cause its output transistor switch to be in one of its two selected states. These circuits 120, 121 and 122 normally receive substantially zero current to put their respective output transistor switches in the opposite state. The low level current supplied by the interface block when the input current is supplied solely through the resistor 140 provides fast transitions and is so low as to meet the requirements of the output switching circuit.

The ratio of the input to output current of the logic interface block 80 maintains a substantially constant ratio with changes in the potentials applied across the transistor therein, i.e., Vp and En.

Figure 5:
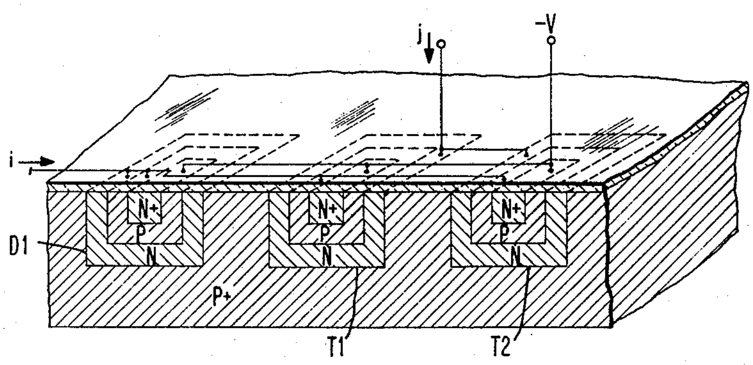
FIG. 5 illustrates diagrammatically the fact that matched transistors of the improved circuits of the present invention are intended to be in integrated form on a single semiconductor chip.

FIG. 5 is a diagrammatic illustration of the interconnection of three transistors in accordance with the teachings of the present invention on a single semiconductor chip. For example, two transistors T1 and T2 are connected in parallel to act as amplifiers and a third transistor D1 is connected with its base-collector electrodes short-circuited by the conductive pattern and interconnected with the base electrodes of the transistors T1 and T2 by way of the conductive pattern. Input current *i* to the three transistors and the corresponding output current *j* from the transistors T1, T2 are illustrated.

Throughout the application the statement has been made with respect to various transistors that certain electrodes are directly connected or short-circuited. By this statement, it is meant that the connection between the electrodes is preferably as low as possible an impedance path. Typically, the lowest impedance path is made by the conventional metallic conductive patterns formed on the semiconductor chip. It will be appreciated, however, that in some cases other techniques may be desirable. For example, very low value resistive diffusions or combinations of resistive underpass diffusions and metallic connections may be used so long as a low impedance path is assured. In general, the connections between emitters of neighboring devices and between bases of neighboring devices must be the lowest impedance available. However, in the connections between collectors of neighboring devices and in those between the base and collector of the same device a somewhat higher impedance can be tolerated.

While the invention has been particularly shown and described with reference to preferred embodiments thereof, it will be understood by those skilled in the art that the foregoing and other changes in form and details may be made therein without departing from the spirit and scope of the invention.

I claim:

1. A signal translating circuit comprising:
a first transistor and a pair of second transistors of one conductivity type having substantially matching base-emitted voltage-current characteristics and each having base, emitter and collector electrodes,
first and second voltage supply terminals,
the emitter electrodes being connected directly to each other and to the first voltage supply terminals,
a source of current,
the base and collector electrodes of the first transistor being connected directly to the base electrodes of the second transistors and the latter collector electrode and the base electrodes being connected directly to the source of current to produce in the collector electrodes of the second transistor a current substantially equal in value to twice that of the source of current,
a third transistor and a pair of fourth transistors of the opposite conductivity type having substantially matching base-emitter voltage-current characteristics and each having base, emitter and collector electrodes,
the emitter electrodes of the third and fourth transistors being connected directly to each other and to the second voltage supply terminal, and
the base and collector electrodes of the third transistor and the base electrodes of the fourth transistors being connected directly to each other and directly to the collector electrodes of the second transistors to produce in the collector electrodes of the fourth transistors a total current substantially equal in value to four times that of the source of current.

2. The circuit of claim 1 wherein said source of current comprises
a source of bias current connected directly to the junction between the base and collector electrodes of the first transistor and the base electrodes of the second transistors, and
a source of input signals connected directly to said junction.

3. A signal translating circuit comprising:
a first transistor and a pair of second transistors of one conductivity type having substantially matching base-emitter voltage-current characteristics and each having base, emitter and collector electrodes,
the emitter electrodes being connected directly to each other and adapted for connection with one voltage supply terminal,
the base and collector electrodes of the first transistor being connected directly to the base electrodes of the second transistors and the latter collector electrode and the base electrodes being adapted for connection directly to a source of current to produce in the collector electrodes of the second transistors a total current substantially equal in value to twice that of the source of current,
a third transistor and a pair of fourth transistors of the opposite conductivity type having substantially matching base-emitted voltage-current characteristics and each having base, emitted and collector electrodes,
the emitter electrodes of the third and fourth transistors being connected directly to each other and adapted for connection with another voltage supply terminal,
the base and collector electrodes of the third transistor and the base electrodes of the fourth transistors being connected directly to each other and directly to the collector electrodes of the second transistors to produce in the collector electrodes of the fourth transistors a total current substantially equal in value to four times that of the source of current.

4. A signal translating circuit comprising:
a predetermined number *n* of first transistors and a predetermined number *m* of second transistors of one conductivity type having substantially matching base-emitter voltage-current characteristics and each having base, emitter and collector electrodes,
the emitter electrodes being connected directly to each other and adapted for connection with one voltage supply terminal, the base and collector electrodes of the first transistors being connected directly to each other and directly to the base electrodes of the second transistors and the latter collector electrodes and the base electrodes being adapted for connection to a source of current having a value represented by I to produce in the collector electrode of each second transistor a current substantially equal in value to *I/n,* a predetermined number *x* of third transistors and a predetermined number *y* of fourth transistors of the opposite conductivity type having substantially matching base-emitter voltage-current characteristics and each having base, emitter and collector electrodes, the emitter electrodes of the third and fourth transistors being connected directly to each other and adapted for connection with another voltage supply terminal; and the base and collector electrodes of the third transistors and the base electrodes of the fourth transistors being connected directly to each other and directly to the collector electrodes of the second transistors to produce in the collector electrode of each fourth transistor a current substantially equal in value to *mI/nx,* the numbers *n, m, x* and *y* being integers equal to or greater than unity.

5. The circuit of claim 4 wherein at least a plurality of the substantially matched transistors are monolithically fabricated on a single semiconductor chip.

6. The circuit as defined in claim 5 wherein the value of the current I is greater than zero, but less than a value which causes saturation in any of the transistors.

7. A signal translating circuit comprising:

a predetermined number *n* of first transistors and a predetermined number *n* of second transistors of one conductivity type having substantially matching base-emitter voltage-current characteristics and each having base, emitter and collector electrodes, first and second voltage supply terminals, the emitter electrodes being connected directly to each other and connected to the first voltage supply terminal, a source of current having a value represented by I, the base and collector electrodes of the first transistors being connected directly to the base electrodes of the second transistors and the latter collector electrodes and the base electrodes being connected directly to the source of current to produce in the collector electrode of each second transistor a current substantially equal to *I/n,* a predetermined number *x* of third transistors and a predetermined number *y* of fourth transistors of the opposite conductivity type having substantially matching base-emitter voltage-current characteristics and each having base, emitter and collector electrodes, the emitter electrodes of the third and fourth transistors being connected directly to each other and connected to the second voltage supply terminal; and the base and collector electrodes of the third transistors and the base electrodes of the fourth transistors being connected directly to each other and to the collector electrodes of the second transistors to produce in the collector electrode of each fourth transistor a current substantially equal in value to *mI/nx,* the numbers *n, m, x* and *y* being integers equal to or greater than unity.

8. The circuit of calim 7 wherein said source of current comprises a source of bias current connected directly to the junction between the base and collector electrodes of the first transistors and the base electrodes of the second transistors, and a source of input signals connected directly to said junction.

9. A video current amplifier comprising:

a voltage supply having a pair of terminals at two different voltage levels;

a plurality of amplifier stages, each having an input terminal and an output terminal;

each of said stages including a predetermined number of first transistors and a predetermined number of second transistors of the same conductivity type having substantially matching base-emitter voltage-current characteristics and each having base, emitter and collector electrodes, the emitter electrodes of each stage being connected directly to each other, the base and collector electrodes of the first transistors being connected directly to each other, directly to the stage input terminal and directly to the base electrodes of the second transistors to produce in the collector electrode of each second transistor a current substantially equal in value to current from the stage input terminal divided by the number of first transistors, and the collector electrodes of the second transistors being connected directly to each other and directly to the output terminal;

the transistors of succeeding stages being of opposite conductivity type, the emitter electrodes of the first and all odd-numbered stages thereafter being connected to one of the voltage supply terminals and the emitter electrodes of the second and all even-numbered stages being connected to the other voltage supply terminal;

the input terminal of the second and all succeeding stages being connected directly to the output terminal of the immediately preceding stage.

10. In a digital logic switching system of the type in which a first transistor switching circuit having an output terminal is adapted to be operated in one or the other of two selected states to produce at the output terminal signals at one or the other of two output levels;

in which a second transistor switching circuit having an input terminal is adapted to be operaed in one or the other of two selected states at least partially in response to the application to its input terminal of a signal at one or the other of two predetermined input levels incident to the operation of the first transistor switching circuit in its first and second states respectively; and in which separate voltage supply means are connected to each of the transistor switching circuits, each supply means having a plurality of terminals at different voltage levels;

the combination with the first and second transistor switching circuits of a logic interface block comprised solely of transistors for effecting the desired operation of the second transistor switching circuit incident to operation of the first transistor switching circuit and characterized by:

at least one first transistor of one conductivity type having its base and collector electrodes short-circuited and connected to receive output signal current from the first transistor switching circuit corresponding substantially to that normally produced in one and the other of its states and having its emitter electrode connected to a selected one of the voltage supply terminals; and at least one second transistor of said one conductivity type having base-emitter voltage-current characteristics substantially matching those of the first transistor having its emitter electrode connected directly to the emitter electrode of said one transistor, having its base electrode connected directly to the short-circuited base and collector electrodes of said one transistor and having its collector electrode connected to the input terminal of the second transistor switching circuit for causing input current in the second transistor switching circuit as a function of current flowing between the first transistor switching circuit and said one transistor and corresponding in value to that normally required for operating the second transistor switching circuit in one and the other of its states.

11. In a digital logic switching system of the type in which a first transistor switching circuit having an output terminal is adapted to be operated in one or the other of two selected states to produce at the output terminal signals at one or the other of two output levels;

in which a second transistor switching circuit physically remote from the first switching circuit and having an input terminal is adapted to be operated in one or the other of two selected states at least partially in response to the application to its input terminal of a signal at one or the other of two predetermined input levels incident to the operation of the first transistor switching circuit in its first and second states respectively; and in which separate voltage supply means are connected to each of the transistor switching circuits, each supply means having a plurality of terminals at different voltage levels;

the combination with the first and second transistor switching circuits of a logic interface block comprised solely of transistors for effecting the desired operation of the second transistor switching circuit incident to operation of the first transistor switching circuit and characterized by:

a predetermined number *n* of first transistors and a predetermined number *m* of second transistors of one conductivity type having substantially matching base-emitter voltage-current characteristics and each having base, emitter and collector electrodes;

the emitter electrodes being connected directly to each other and directly to one of the voltage supply terminals;

the base and collector electrodes of the first transistors being connected directly to each other, directly to the base electrodes of the second transistors and directly to the output terminal of the first transistor switching circuit to produce in the collector electrode of each second transistor a current substantially equal in value to $I/n$, where I is the value of the output current from the first transistor switching circuit;

a predetermined number *x* of third transistors and a predetermined number *y* of fourth transistors of the opposite conductivity type having substantially matching base-emitter voltage-current characteristics and each having base, emitter and collector electrodes, the collector electrodes of the fourth transistors being connected directly to each other and directly to the input terminal of the second transistor switching circuit;

the emitter electrodes of the third and fourth transistors being connected directly to each other and directly to another of the voltage supply terminals; and the base and collector electrodes of the third transistors and the base electrodes of the fourth transistors being connected directly to each other and directly to the collector electrodes of the second transistors to produce in the collector electrode of each fourth transistor a current substantially equal in value to $mI/nx$.

the numbers *n, m, x* and *y* being integers equal to or greater than unity and selected to provide the desired input current levels for operating the second transistor switching circuit incident to operation of the first switching circuit.

12. In a digital logic switching system of the type in which a first transistor switching circuit is adapted to be operated in one or the other of two selected states to produce at an output terminal signals at one or the other of two levels;

in which a second transistor switching circuit having an input terminal is adapted to be operated in one or the other of two selected states at least partially in response to the application to its input terminal of a signal at one or the other of two predetermined levels incident to the operation of the first transistor switching circuit in its first and second states respectively; and in which separate voltage supply means are connected to each of the transistor switching circuits, each supply means having a plurality of terminals at different voltage levels;

the combination with the first and second transistor switching circuits of a logic interface block comprised solely of transistors for effecting the desired operation of the second transistor switching circuit incident to operation of the first transistor switching circuit and characterized by:

a plurality of current amplifying stages, each having input and output terminals, the first stage having its input terminal connected to the output terminal of the first transistor switching circuit, succeeding stages having their input terminals connected to the output terminals of preceding stages, and the last stage having its output terminal connected to the input terminal of the second transistor switching circuit;

each stage including a predetermined number of first transistors and a predetermined number of second transistors of the same conductivity type having substantially matching base-emitter voltage-current characteristics and each having base, emitter and collector electrodes, the emitter electrodes being connected directly to each other, the base and collector electrodes of the first transistors being connected directly to the base electrodes of the second transistors and to the stage input terminal and receiving input current represented by I to produce in the collector electrode of each second transistor a current substantially equal in value to I divided by the number of first transistors, and the collector electrodes of the second transistors being connected directly to the stage output terminal;

succeeding stages being comprised of transistors of opposite conductivity type;

the first and all odd-numbered stages having their emitter electrodes connected to one terminal of the voltage supply to which the first transistor switching circuit is connected and the second and all even-numbered stages having their emitter electrodes connected to one terminal of the voltage supply to which the second transistor switching circuit is connected, the number of stages and the transistor conductivity types being selected to provide the desired relative directions of current flow in the first and last stages of the interface block; and the first and each stage except the last providing the sole source of current for its next succeeding stage.

13. In a digital logic switching system of the type in which a first transistor switching circuit having an output terminal is adapted to be operated in one or the other of two selected states to produce at the output terminal signals at one or the other of two output levels;

in which a second transistor switching circuit having an input terminal is adapted to be operated in one or the other of two selected states at least partially in response to the application to its input terminal of a signal at one or the other of two predetermined input levels incident to the operation of the first transistor switching circuit in its first and second states respectively; and in which voltage supply means having a plurality of terminals at different voltage levels are connected to each of the transistors switching circuits;

the combination with the first and second transistor switching circuits of a logic interface block comprised solely of transistors for effecting the desired operation of the second transistor switching circuit incident to operation of the first transistor switching circuit and characterized by:

at least one first transistor of one conductivity type having its base and collector electrodes short-circuited and connected to receive output signal current from the first transistor switching circuit corresponding substantially to that normally produced in one and the other of its states and having its emitter electrode connected to a selected one of the voltage supply terminals; and at least one second transistor of said one conductivity type having base-emitter voltage-current characteristics substantially matching those of the first transistor having its emitter electrode connected directly to the emitter electrode of said one transistor, having its base electrode connected directly to the short-circuited base and collector electrodes of said one transistor and having its collector electrode connected to the input terminal of the second transistor switching circuit for causing input current in the second transistor switching circuit as a function of current flowing between the first transistor switching circuit and said one transistor and corresponding in value to that normally required for operating the second transistor switching circuit in one and the other of its states.

14. In a digital logic switching system of the type in which a first transistor switching circuit having an output terminal is adapted to be operated in one or the other of two selected states to produce at the output terminal signals at one or the other of two output levels;

in which a second transistor switching circuit physically remote from the first switching circuit and having an input terminal is adapted to be operated in one or the other of two selected states at least partially in response to the application to its input terminal of a signal at one or the other of two predetermined input levels incident to the operation of the first transistor switching circuit in its first and second states respectively; and in which voltage supply means having a plurality of terminals at different voltage levels are connected to each of the transistor switching circuits;

the combination with the first and second transistor switching circuits of a logic interface block comprised solely of transistors for effecting the desired operation of the second transistor switching circuit incident to operation of the first transistor switching circuit and characterized by:

a predetermined number $n$ of first transistors and a predetermined number $m$ of second transistors of one conductivity type having substantially matching base-emitter voltage-current characteristics and each having base, emitter and collector electrodes;

the emitter electrodes being connected directly to each other and directly to one of the voltage supply terminals;

the base and collector electrodes of the first transistors being connected directly to each other, directly to the base electrodes of the second transistors and directly to the output terminal of the first transistor switching circuit to produce in the collector electrode of each second transistor a current substantially equal in value to $I/n$, where I is the value of the output current from the first transistor switching circuit;

a predetermined number $x$ of third transistors and a predetermined number $y$ of fourth transistors of the opposite conductivity type having substantially matching base-emitter voltage-current characteristics and each having base, emitter and collector electrodes, the collector electrodes of the fourth transistors being connected directly to each other and directly to the input terminal of the second transistor switching circuit;

the emitter electrodes of the third and fourth transistors being connected directly to each other and directly to another of the voltage supply terminals; and the base and collector electrodes of the third transistors and the base electrodes of the fourth transistors being connected directly to each other and directly to the collector electrodes of the second transistors to produce in the collector electrode of each fourth transistor a current substantially equal in value to $mI/nx$, the numbers $n$, $m$, $x$ and $y$ being integers equal to or greater than unity and selected to provide the desired input current levels for operating the second transistor switching circuit incident to operation of the first switching circuit.

15. In a digital logic switching system of the type in which a first transistor switching circuit is adapted to be operated in one or the other of two selected states to produce at an output terminal signals at one or the other of two levels;

in which a second transistor switching circuit having an input terminal is adapted to be operated in one or the other of two selected states at least partially in response to the application to its input terminal of a signal at one or the other of two predetermined levels incident to the operation of the first transistor switching circuit in its first and second states respectively; and in which voltage supply means having a plurality of terminals at different voltage levels are connected to each of the transistor switching circuits;

the combination with the first and second transistor switching circuits of a logic interface block comprised solely of transistors for effecting the desired operation of the second transistor switching circuit incident to operation of the first transistor switching circuit and characterized by:

a plurality of current amplifying stages, each having input and output terminals, the first stage having its input terminal connected to the output terminal of the first transistor switching circuit, succeeding stages having their input terminals connected to the output terminals of preceding stages, and the last stage having its output terminal connected to the input terminal of the second transistor switching circuit;

each stage including a predetermined number of first transistors and a predetermined number of second transistors of the same conductivity type having substantially matching base-emitter voltage-current characteristics and each having base, emitter and collector electrodes, the emitter electrodes being connected directly to each other, the base and collector electrodes of the first transistors being connected directly to the base electrodes of the second transistors and to the stage input terminal and receiving input current represented by I to produce in the collector electrode of each second transistor a current substantially equal in value to I divided by the number of first transistors, and the collector electrodes of the second transistors being connected directly to the stage output terminal;

succeeding stages being comprised of transistors of opposite conductivity type;

the first and all odd-numbered stages having their emitter electrodes connected to one terminal of the voltage supply to which the first transistor switching circuit is connected and the second and all even-numbered stages having their emitter electrodes connected to one terminal of the voltage supply to which the second transistor switching circuit is connected, the number of stages and the transistor conductivity types being selected to provide the desired relative directions of current flow in the first and last stages of the interface block; and the first and each stage except the last providing the sole source of current for its next succeeding stage.

References Cited

UNITED STATES PATENTS

| | | | |
|---|---|---|---|
| 3,392,342 | 7/1968 | Ordower | 330—38 X |
| 3,422,282 | 1/1969 | Orrell | 307—203 |

ROY LAKE, Primary Examiner

J. B. MULLINS, Assistant Examiner

U.S. Cl. X.R.

307—215, 237, 270; 330—17, 38

PO-1050
(5/69)

UNITED STATES PATENT OFFICE
CERTIFICATE OF CORRECTION

Patent No. 3,509,364 Dated April 28, 1970

Inventor(s) Frederick Buckley

It is certified that error appears in the above-identified patent and that said Letters Patent are hereby corrected as shown below:

In the claims, Claim 1, Column 11, line 73, the word "emitted" should read --emitter--. Claim 7, Column 13, line 35, "number n" should read --number m--; line 50, after "equal" insert --in value--. Claim 8, Column 13, line 70, the word "calim" should read --claim--. Claim 11, Column 15, line 67, "mI/nx." should read --mI/nx,--.

SIGNED AND SEALED
SEP 22 1970

(SEAL)
Attest:

Edward M. Fletcher, Jr.
Attesting Officer

WILLIAM E. SCHUYLER, JR.
Commissioner of Patents